United States Patent
Mansoorian et al.

(10) Patent No.: US 10,043,843 B2
(45) Date of Patent: Aug. 7, 2018

(54) STACKED PHOTODIODES FOR EXTENDED DYNAMIC RANGE AND LOW LIGHT COLOR DISCRIMINATION

(71) Applicant: Forza Silicon Corporation, Pasadena, CA (US)

(72) Inventors: Barmak Mansoorian, La Canada Flintridge, CA (US); Daniel Van Blerkom, Altadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 498 days.

(21) Appl. No.: 14/504,297

(22) Filed: Oct. 1, 2014

(65) Prior Publication Data

US 2015/0090863 A1 Apr. 2, 2015

Related U.S. Application Data

(60) Provisional application No. 61/885,358, filed on Oct. 1, 2013, provisional application No. 61/921,632, filed on Dec. 30, 2013.

(51) Int. Cl.
*H01L 27/00* (2006.01)
*H01L 27/146* (2006.01)

(52) U.S. Cl.
CPC .... *H01L 27/14643* (2013.01); *H01L 27/1461* (2013.01); *H01L 27/1464* (2013.01); *H01L 27/14632* (2013.01); *H01L 27/14634* (2013.01); *H01L 27/14636* (2013.01); *H01L 2924/0002* (2013.01)

(58) Field of Classification Search
CPC ............. H01L 27/146; H01L 27/14607; H01L 27/14609; H01L 27/14632
USPC ................... 250/208.1, 214.1; 257/432, 436
See application file for complete search history.

(56) References Cited

U.S. PATENT DOCUMENTS

| | | | |
|---|---|---|---|
| 2007/0023801 A1* | 2/2007 | Hynecek | H01L 27/14609 257/292 |
| 2010/0276736 A1* | 11/2010 | Bocko | H01L 27/14632 257/291 |
| 2011/0156114 A1 | 6/2011 | Park | |
| 2013/0009263 A1 | 1/2013 | Hatano | |
| 2013/0075607 A1 | 3/2013 | Bikumandla | |
| 2014/0042298 A1* | 2/2014 | Wan | H01L 27/14634 250/208.1 |

\* cited by examiner

*Primary Examiner* — Kevin Pyo

(57) ABSTRACT

The invention provides the art with novel image sensor pixel designs comprising stacked, pinned photodiodes. The stacked pinned photodiodes provide pixels with greatly increased dynamic range. The stacked pinned photodiodes also allow improved color discrimination for low light imaging, for example utilizing pixels with no overlaying color filter array.

9 Claims, 2 Drawing Sheets

Figure 1:
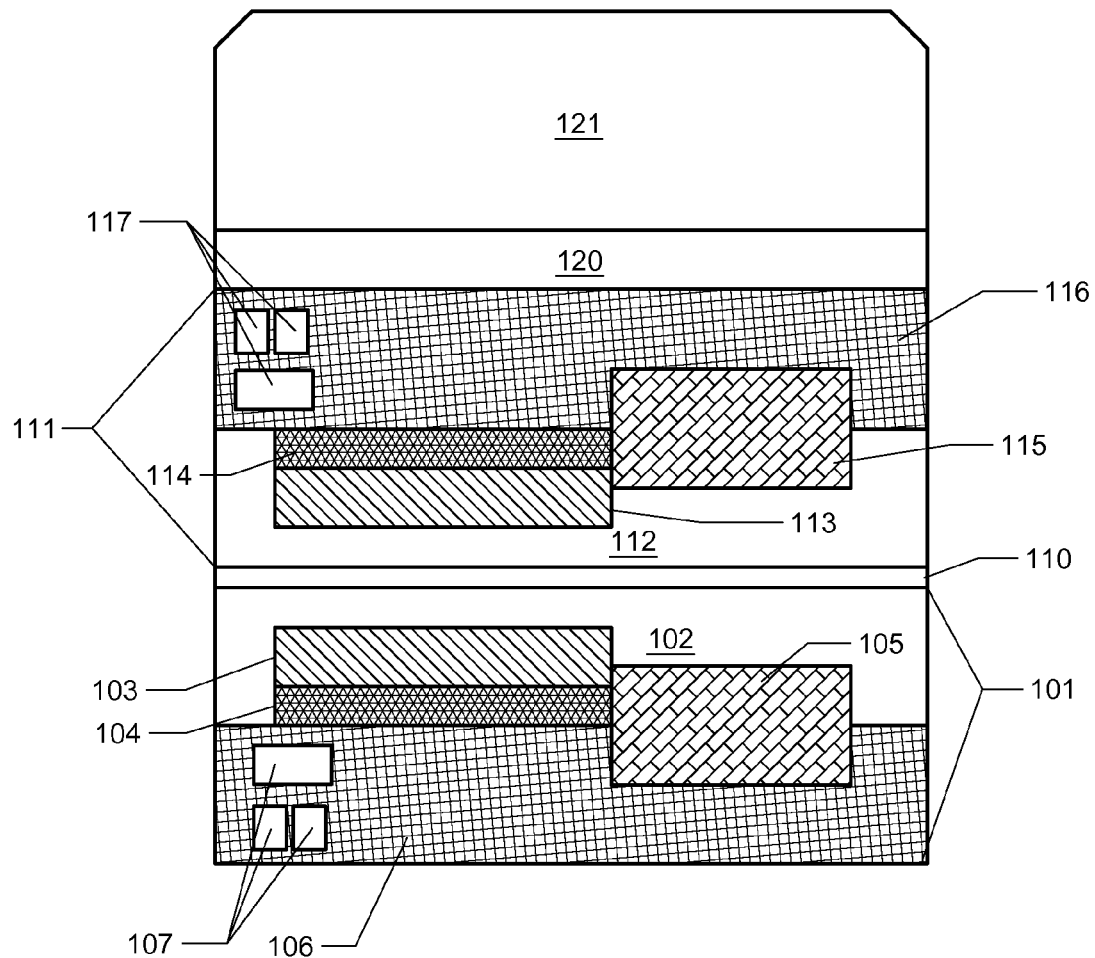

STACKED PHOTODIODES FOR EXTENDED DYNAMIC RANGE AND LOW LIGHT COLOR DISCRIMINATION

CROSS-REFERENCE TO RELATED APPLICATIONS

This application claims the benefit of priority to U.S. Provisional Application Ser. No. 61/885,358, entitled "Stacked Photodiodes for Extended Dynamic Range," filed Oct. 1, 2013, and to U.S. Provisional Application Ser. No. 61/921,632, entitled "Stacked Photodiodes for Color Determination and Extended Dynamic Range in Low Light Imaging," filed Dec. 30, 2013, the contents of both of which are hereby incorporated by reference.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not Applicable

BACKGROUND OF THE INVENTION

The present inventions are directed to image sensors, particularly CMOS image sensors. Much progress has been made in the field of image sensor design, yet current sensor designs suffer from shortcomings in various aspects. One issue that presents problems for conventional image sensors is limited dynamic range. Dynamic range is the ratio of the maximum measurable signal to the minimal measurable signal. When capturing an image of a scene in which some regions are highly illuminated and others are shadowed, the limited dynamic range of conventional pixel designs used in image sensors leads to a loss of information. Unable to record the full range of tones within the scene, at a given exposure time, a conventional image sensor will typically underexpose the dark regions or overexpose the illuminated regions, such that detail in some portion of the image is lost.

Another shortcoming of conventional image sensor performance is in the arena of low light photography. Low light settings present various problems in digital photography, including color discrimination issues in addition to dynamic range issues. Standard image sensor designs utilize an array of pixels overlaid with an array of color filters, such as a Bayer array or similar means of separating wavelengths to discriminate color within a region of the image. However, the use of the color filter presents a significant disadvantage in a low-light setting because the filter absorbs a substantial proportion of the incoming light, leaving little signal for capture by the pixel. Additionally, the use of a color filter array results in a loss of spatial resolution as the image is reformed. Also, the use of a color filter array causes an increase in image noise due to artifacts inherently produced by color reconstruction processing when the missing colors in each pixel are computationally interpolated.

A known method for extending the light-harvesting capabilities of an image sensor is to remove the color filter array from the pixels, for example as found in the Ricoh Monochrome GRD camera system. However, the resulting images from such sensors are monochromatic (black and white) or otherwise severely lacking in color information. Another method for interpolating color at low light involves the use of "sparse" color filters, wherein color filters are utilized but a substantial portion of the image sensor pixels do not have color filters, for example as embodied in the Truesense™ imaging system. However, such sparse color methodologies require intensive image processing to estimate color, leading to substantial artifacts Another issue encountered in low-light situations is the presence of highly illuminated areas of the image among very low light areas. For example, within a night scene, there may be local bright spots around lighting fixtures while deeply shadowed areas nearby are very poorly lit. Conventional sensors will often fail to capture image detail in such scenes because the well-lit areas are overexposed (i.e. pixels are saturated) and/or the dark areas are underexposed (i.e. little or no light is captured by the pixel and no image detail is resolvable). Accordingly, there is a need in the art for low-light sensors with very high dynamic range such that differentially illuminated portions of a scene may be effectively imaged.

The present invention addresses these dynamic range and low light color discrimination issues with novel sensor designs and associated methods of using such designs. The present disclosure provides the art with various solutions based upon stacked image sensors, as described below.

SUMMARY OF THE INVENTION

The novel image sensors of the invention, and methods of using them, are based on various stacked photodiode pixel designs. In one aspect, the stacked photodiode pixels of the invention provide a means of extending dynamic range. The designs comprise, in an exemplary embodiment, an upper and a lower photodiode. In the event of a high photon flux wherein the upper photodiode becomes saturated, the attenuated light received by the lower photodiode may be used to determine the photon flux incident upon the pixel, extending the dynamic range of the system beyond what is capable with a single photodiode.

In another aspect, the stacked image sensors and associated methods of the invention provide a system for color discrimination in low light conditions. In combination with the signal received by the upper photodiode, the attenuated light signal received by the lower photodiode may be used to determine color, based on the predicted attenuation profile of the device, which is wavelength dependent.

The stacked photodiode image sensors of the invention will next be described in greater detail.

BRIEF DESCRIPTION OF THE SEVERAL DRAWINGS

FIG. 1 depicts a cross-sectional view of a stacked pixel. The pixel is made up of two stacked wafers, a bottom wafer (101) and a top wafer (111), with a frontside illuminated pixel on the top wafer and a backside illuminated pixel on the bottom wafer. Each pixel comprises a photodiode (103 and 113), each photodiode having a heavily doped pinning layer (104 and 114).

Figure 2:
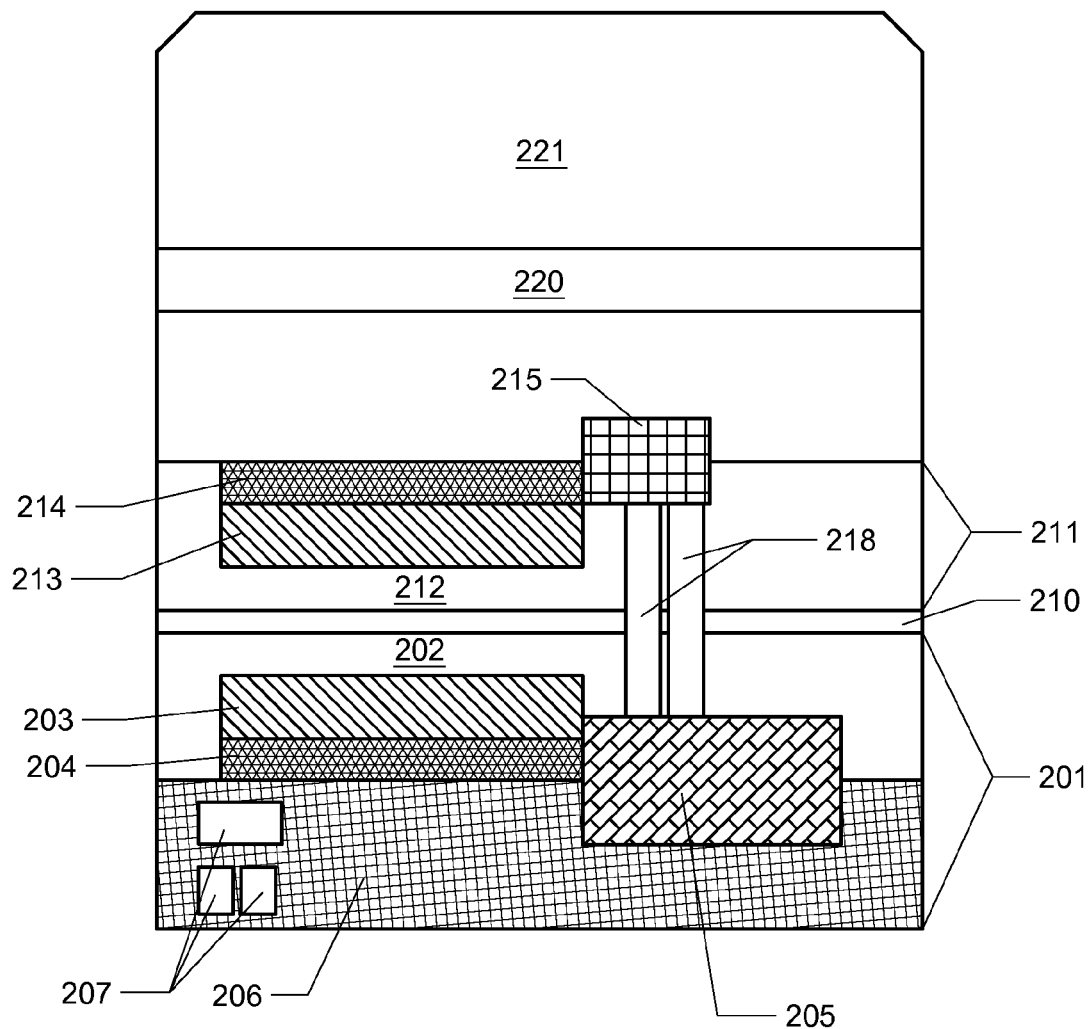

FIG. 2 depicts a cross sectional view of an asymmetric stacked pixel. The stacked pixel is made up of two wafers, a bottom wafer (201) and a top wafer (211). The top wafer comprises a photodiode (213) with a heavily doped pinning layer (214), and a transfer gate (215). The bottom wafer comprises a photodiode (203) with a heavily doped pinning layer (204) as well as readout and reset components (205).

DETAILED DESCRIPTION OF THE INVENTION

The novel image sensors, and methods of using them, presented herein are based on the use of stacked photodiodes, wherein each photodiode is present on a separate wafer and the wafers are subsequently stacked to create the functional device. Advantageously, this allows for each of the photodiodes in the stack to be pinned. As known in the art, pinning is the use of a relatively heavily doped layer upon the photodiode's storage well region, which helps maintain the photodiode at a fixed potential and greatly decreases noise from surface interface effects.

In one implementation, the function of the photodiode stack is to provide a greatly increased overall well capacity resistant to saturation when photon flux is high, i.e., the stacked photodiodes are utilized to extend the dynamic range of the sensor. In the event that the upper photodiode becomes saturated, the lower photodiode or photodiodes will collect a measurable signal that can be used to determine total flux incident upon the pixel. Such designs may be used with or without overlaying color filters, as described below.

In another implementation, the function of the stacked pinned photodiodes is to provide low noise signals that can be used for color discrimination, especially in low light applications where an overlying color filter is not used.

Various stacked image sensor designs are known in the art. For example, the Foveon™ X3 sensor utilizes three stacked photodiodes manufactured within a single wafer of silicon. The attenuation of light as it passes through the wafer is wavelength dependent, so the photodiodes of the device, being at different depths on the wafer, will absorb different wavelengths of light, allowing color discrimination. However, the implant process utilized to create pinned photodiodes, as known in the art, is not capable of creating a pinning layer deep within the silicon, and multiple pinned photodiodes cannot be produced in a single wafer. Therefore, the Foveon sensor and like designs utilize one or more unpinned photodiodes, wherein signal read noise is very high. This increased noise makes the Foveon stacked photodiode approach highly unsuitable for low-light imaging.

Another stacked image sensor design is embodied in United States Patent Application Publication Number 2013/0009263, entitled "Solid State Imaging Device and Electronic Apparatus." This application discloses various stacked photodiode designs, but no pinning layer is used in the photodiodes. The purpose of the photodiode stacks is to improve color discrimination, and no dynamic range improvements are taught. Likewise, stacked photodiodes are described in United States Patent Application Publication Number 2013/007560 entitled "Image sensors having stacked photodector arrays." This application describes stacked photodiodes wherein an upper and lower photodiode each absorb different wavelengths of light. In contrast with the present invention, no pinned photodiodes are taught or suggested in Patent Application Publication Number 2013/007560, and no dynamic range improvement is taught.

The devices and associated methods of the present invention may be implemented in various configurations. "Image sensors," as used herein, will refer to arrays of photodector sites, a.k.a., a "pixels." A "stacked image sensor" will refer to an image sensor comprising an array of stacked pixels or an array of pixels comprising stacked photodiodes, depending on configuration, as set forth below. Each stacked pixel will comprise two or more photodiodes and associated components for measuring charge accumulated on the photodiodes during the integration phase, reading out of such measured charges, and resetting of charge-accumulating components (e.g. photodiode and floating diffusion node). Additional components and functions, such as transistors and capacitors for correlated double sampling operations and/or global shutter operation may be included within each stacked pixel.

For ease of reference, and in accordance with the accompanying drawings, embodiments of the invention will be described from a cross-sectional viewpoint as having a "top to bottom" orientation. The surface of the image sensor which receives incoming light from the optics system of the camera will be referred to as the top surface and elements which are increasingly distal to this top surface will be described as being increasingly "lower." When elements are described with respect to one another, an element referred to as "lower," "under," or on the "bottom" with respect to a named structure will be an element that is more distal to the light-receiving top surface than the named structure.

In some embodiments, the stacked photodiodes of the invention comprise two photodiodes. For convenience, the several drawings provided herein and the following description will be directed to stacked pixels comprising two photodiodes. However, it will be understood that the devices and methods of the invention may be utilized with three or more stacked photodiodes.

The photodiodes of the invention may be of any type known in the art. Common CMOS image sensor materials include epitaxial silicon wafers. An exemplary wafer of the invention is a p-type silicon wafer. Photodiodes can be made on such wafers by implanting a region of the wafer with n dopants to create an n-type region within the surrounding p-type silicon. To pin the photodiode, a pinning layer is created on top of the n-type region by implanting a thin layer of heavily p-doped silicon, as known in the art. It will be understood that alternative materials may be used, for example, a p-type photodiode within an n-type silicon wafer may serve as the photodiode.

The stacked photodiodes of the invention may be configured in various ways. For example, in one embodiment, the invention comprises a symmetrical stacked pixel, wherein each wafer comprises a fully functional pixel and the two wafers are stacked one on tope of the other. Fully functional pixel means that all or substantially all components necessary for pixel function are present on the same wafer. For example, a fully functional pixel consist of a photodiode, components for measuring charge accumulated on the photodiode during each integration cycle (e.g. a transfer gate, a floating diffusion node, and a source follower amplifier), components for resetting the photodiode (e.g. a reset transistor and voltage supply), and components for readout of the signal corresponding to the accumulated charge (a row select transistor and signal output line). Components for correlated double sampling and/or global shutter operation may be present as well. In a fully functional pixel, the column buses for pixel readout, and control signal lines will also be present on the same wafer as the photodiode. A symmetrical stacked pixel can be conceptualized as two standard image sensor wafers stacked on top of each other, aligned such that the photodiodes of the top and bottom layers are substantially vertically aligned., i.e., on each wafer the pixels.

For example, one exemplary embodiment of the symmetrical stacked pixel is illustrated, in a cross sectional view, in FIG. 1. The device of FIG. 1 comprises a pair of stacked wafers, a bottom wafer (101) and a top wafer (111) each comprising a fully functional pixel, stacked so as to create a stacked pixel. The top pixel is a "frontside illuminated" pixel. The top pixel has a photodiode region (113) within the wafer body (112), the photodiode having a pinning layer (114). The photodiode is in proximity to readout and reset components (105), depicted herein simply as a single box, however it will be understood that these components may be distributed in various configurations and the invention is not limited to any precise arrangement of such components. Exemplary readout and reset components include a transfer gate which controls the flow of charge carriers accumulated on the photodiode to a floating diffusion node, which may be connected to various readout and reset components such as a source follower amplifier, correlated double sampling components, reset transistors, and a voltage source, etc. The top pixel is overlaid by a metallization layer (116) which may comprise wiring and interconnects (107). The bottom wafer (101) comprises a "backside illuminated" pixel. The lower pixel comprises a photodiode (103) within the wafer body (102), the photodiode having a pinning layer (104). The pinned photodiode is in proximity to associated readout and reset components (105), here depicted as a single box, however it will be understood that these components may be distributed in various configurations and the invention is not limited to any precise arrangement of such components. The bottom wafer further comprises as metallization layer (106) which may comprise wiring (107) such as control signal lines. The top and bottom wafers are aligned and bonded, the junction between them (110) optionally comprising an adhesive, an insulating layer, or other material depending on the type of wafer bonding used. The embodiment illustrated in FIG. 1 may optionally further comprise a microlens (121) and color filter (120) assembly.

It is understood that symmetrical stacked pixel embodiment may comprise different arrangements of fully functional pixels other than the exemplary "frontside-on-backside" configuration illustrated in FIG. 1. For example, different configurations of frontside illuminated and backside illuminated top and bottom pixels may be used, including frontside-on-frontside, backside-on-backside, or backside-on-frontside arrangements.

The advantage of stacking fully functional pixels is that each layer of the device may be made using standard manufacturing techniques, followed by alignment and wafer bonding to create the stacked pixel array.

In an alternative embodiment, the two or more photodiodes of the stacked pixel reside on separate wafers, while the components required for pixel function, (e.g. charge measurement, readout, and reset) are asymmetrically distributed. In other words, at least some components necessary for the measurement of accumulated charge and rest of one photodiode are present on the opposite wafer as the photodiode. Interconnects between the top and bottom wafer conduct voltage sources, signal outputs, and control between wafers. Exemplary interconnects include through silicon vias, as known in the art.

For example, an exemplary asymmetric stacked pixel design is depicted in FIG. 2. Herein, the top wafer (211) comprises a photodiode (213) within the wafer body (212), the photodiode having a pinning layer (214) and transfer gate (215). The bottom wafer (201) comprises a photodiode (203) within the wafer body (202), the photodiode having a pinning layer (204) and also having associated readout and reset components (205), which perform such functions for both photodiodes. Interconnects (218) between the top and bottom wafer control the top wafer transfer gate and allow charge accumulated on the top photodiode to pass to a floating diffusion node on the bottom wafer. The bottom wafer further comprises as metallization layer (206) which may comprise wiring (207) such as control signal lines. The top and bottom wafers are aligned and bonded, the junction between them (210) optionally comprising an adhesive, an insulating layer, or other material depending on the type of wafer bonding used. The embodiment illustrated in FIG. 2 may optionally further comprise a microlens (221) and color filter (220) assembly.

It will be understood that the asymmetric stacked pixel embodiment of FIG. 2 may be arranged in any configuration such that the top and bottom wafers do not both comprise fully functional pixels. For example, the top wafer may further comprise a floating diffusion node and one or more components for readout. The advantage of an asymmetric stacked pixel architecture is that components for the readout and resetting of the top photodiode can be located on the bottom photodiode. In this way, the distance and the amount of intervening structures between the two photodiodes can be minimized, such that light incident upon the lower photodiode is less attenuated.

In an alternative implementation of the asymmetric stacked pixel concept, the invention comprises a stack of three wafers. The top wafer and the middle wafer comprise pinned photodiodes and transfer gates, while a third wafer on the bottom of the stack comprises the pixel circuitry necessary for reading and resetting accumulated charge on the two photodiodes, by use of interconnects such as through silicon vias. The advantage of this three wafer design is that the top two wafers may comprise materials optimized for high quality photodiodes and the bottom wafer may comprise materials optimized for fabrication of circuits, for example as described in pending U.S. patent application Ser. No. 14/504,270, entitled "Elemental stacked image sensor."

In the stacked wafer designs of the invention, alignment and bonding of the two or more wafers may be carried out using any process known in the art, for example bump bonding, direct wafer bonding, thermocompressive bonding, adhesive bonding, etc. The junction between the two wafers may comprise one or more layers of material, for example, an insulating or dielectric layer to discourage cross-talk between the two pixels of the pixel stack, and/or an adhesive layer to facilitate bonding.

If an intervening layer of material between the two wafers is utilized, it is generally preferred that the material be highly transmissive of light and also have an index of refraction matched to that of the silicon-based wafers, in order to eliminate or minimize interference or artifacts at the interface between the two wafers. Alternatively, the intervening layer or layer may have selected optical properties to perform a filtering function. One of skill in the art will be able to tailor the optical properties of the intervening layer or layers, for example by tuning the thickness, index of refraction, and patterning of the intervening material between the two wafers in order to control the reflection and transmission of the light between the two wafers. In one embodiment, the intervening layer comprises a dielectric layer which creates a narrow-wavelength band filter to filter out selected wavelengths. For example, in one embodiment, the intervening layer comprises a narrow-wavelength band filter to prevent a targeting laser designator light from hitting the second photodiode.

The asymmetrical stacked photodiodes of the invention may have separate floating diffusion nodes, i.e. charge accumulated on each photodiode is transferred to separate nodes for readout. In an alternative embodiment, the accumulated charge on each photodiode is transferred to a shared floating diffusion node. Readout of the pixel may occur by any means. For example, in one embodiment, the two photodiodes are read out using separate column buses. In an alternative embodiment, the two photodiodes are read out to a shared column bus sequentially. In yet another embodiment, the voltage signals representing stored charge on the two photodiodes are combined and read out as a single signal. Correlated double sampling may likewise be performed in various ways, for example with separate reset signals from each photodiode or a shared signal representing both photodiodes' reset voltages.

In the diagrams provided herein, the photodiodes are depicted as being the same size and being substantially vertically aligned. However, it will be understood that the two or more stacked photodiodes of the invention may be different sizes and may be offset from each other, such that they are only partially overlapping.

Each stacked pixel may be overlaid by a microlens and/or color filter assembly, as known in the art, for example a Bayer array of color filters. Antireflective coatings, as known in the art, may also be employed on the light-receiving surface of the photodiode to increase yield.

In one embodiment, the top photodiode and bottom photodiode have synchronized integration and reset cycles. In an alternative embodiment, the two photodiodes in a stacked pixel have asynchronous integration and readout signals.

In one embodiment, the top and bottom wafers of each stacked photodiode pixel operate independently and differentially in terms of charge accumulation, signal generation, and readout. For example, in one embodiment, the top wafer comprises an image sensor comprising an array of pixels and the bottom wafer comprises an image sensor comprising an array of pixels, wherein each image sensor operates independently of the image sensor on the opposing wafer. In one embodiment, one such image sensor is configured to operate in rolling shutter mode and the other image sensor is configured to operate in global shutter mode.

Low Light Color Applications

Prior art stacked image sensors do not utilize pinned photodiodes. Accordingly, excessive read noise is inherent in such systems. In contrast, the sensors, systems, and methods of the invention enable color discrimination in low light conditions by the use of stacked pinned photodiodes, providing color discrimination in low light without the artifacts and other disadvantages of the prior art systems.

In general, the low light stacked pixel arrays of the invention will not utilize an overlaid color filter array. This maximizes the amount of light incident upon the photodiode stack. However, it will be understood that color filters may be present in the stacked pixel array, for example in sparse configurations, in order to provide additional data for color reconstruction.

Color discrimination is enabled by comparing the photon flux incident upon each of the two photodiodes. Light flux reaching the bottom photodiode is attenuated compared to the flux experienced by the top photodiode due to the presence of intervening silicon and other structures (e.g. signal and control lines). For any given device composition and architecture, the attenuation occurs in a predictable wavelength-dependent manner, depending on the material or materials it is passing through or is obstructed by. Accordingly, the incident wavelength can be estimated based on the measured degree of attenuation between the top and bottom photodiodes.

In general, the flux of photons passing through a given distance of a material is predictably attenuated by absorption and scattering of light, with the degree of attenuation varying predictably with varying wavelength. If a given quanta of light, Q1, is incident upon the top photodiode and a second quanta of light, Q2 is incident upon the bottom photodiode, Q1-Q2 represents the differential flux. In a silicon device, the differential will be relatively high if the incident light is blue, since shorter wavelengths are more highly absorbed (i.e. silicon has a higher attenuation coefficient for blue light), while the differential will be relatively lower if the incident light is red, since longer wavelengths penetrate more deeply into silicon (i.e. silicon has a lower attenuation coefficient for longer wavelengths). Intermediate wavelengths (e.g. green) will have a differential intermediate between that observed for blue or red light.

The effective attenuation coefficient between the top photodiode and the bottom photodiodes for light of a given wavelength will depend on the vertical distance between the photodiodes and the composition of the material between the two photodiodes, as well as the presence of any light blocking structures. Other factors that may affect attenuation coefficient are the effects of doping on light transmission within the silicon, and the optical effects, if any, present at the interface between the two bonded wafers. In a preferred implementation, there are minimal, structures (e.g. wires or interconnects) between the upper and lower photodiodes. However, in some implementations there may be structures found within the intervening space between the photodiodes which absorb and/or scatter light. For example, control lines, row and column bus lines, transistor gates, floating diffusion nodes, or other structures found in pixels may be present. However, since the composition and arrangement of such structures is fixed within a given device, the attenuation caused by any such intervening structures will be predictable and can be accounted for by estimation based on the size, location, and composition of such structures. Alternatively, the effective attenuation coefficient of the material between the photodiodes may be directly measured by exposing the device to a range of different wavelengths (e.g. a range of wavelengths between 200 to 1500 nm) and measuring the differential in photon flux at the two photodiodes at various wavelengths. The net result is a device-specific attenuation coefficient vs. wavelength relationship.

Once the effective attenuation coefficient curve is obtained (either by estimation, direct measurement, or a combination thereof), the measured attenuation in photon flux between the top and bottom photodiodes can be used to extrapolate the average incident wavelength.

For example, in one embodiment, the following or similar methodologies may be utilized for color discrimination. Equation 1 describes a method of calculating photon flux of substantially single-wavelength light as a function of depth in a material:

$$F(x) = F(x_0) e^{-\alpha(x-x_0)} \qquad \text{Equation 1:}$$

where $F(x)$ is the intensity at a point x below the surface of the material, $F(x_0)$ is the intensity at a surface point $x_0$, and $\alpha$ is the absorption coefficient, which determines the depth at which light of a certain wavelength penetrates the material. Solving for $\alpha$, the equation becomes:

$$\alpha = \frac{LnF(x0) - LnF(x)}{(x - x0)} \qquad \text{Equation 2}$$

Applying this equation in the context of the invention, the photon flux incident upon the top photodiode is $Fx_0$, the photon flux incident upon the bottom photodiode is $Fx$, and the quantity $(x-x_0)$ is a fixed constant based on the architecture of the device. Measured values of a may then be compared to the device-specific attenuation coefficient curve to extrapolate the wavelength of the incident light. This allows assignment of a color value to that pixel.

The calculated wavelength will represent an average wavelength of the incident photons, which in reality may be of various wavelengths. In some embodiments, additional color reconstruction algorithms, as known in the art, may be applied to correct artifacts caused by the flux of multi-wavelength photons.

It will be understood that the stacked photodiode architectures and associated color determination methods described herein may be utilized in combination with other image sensor types, for example in hybrid mosaics comprising stacked pixels of the invention interspersed with other types of pixels. For example, the invention may be utilized in conjunction with sparse color architectures, wherein dispersed color filters are employed to provide information that can also be used in color interpolation processing.

In one aspect, the invention comprises a method of extrapolating the average wavelength incident upon a photodetector site by the use of stacked pinned photodiodes. In this method, a top pinned photodiode and a bottom pinned photodiode, having an intervening region disposed between the two, are utilized, wherein the light attenuation properties of the intervening region are known. Light absorbed by the top pinned photodiode and the bottom pinned photodiode is measured during an integration cycle as the accumulation of charge by each photodiode. Using the observed differential in light absorption between the top pinned photodiode and the bottom pinned photodiode, and taking into account the known wavelength dependent attenuation coefficient of the intervening region, the average wavelength of the incident light is calculated.

Extended Dynamic Range Applications

When the incident light exceeds the capacity of a standard pixel's photodiode to absorb such light and convert such absorption events to measurable charge, the pixel is saturated, resulting in a loss of image data and a washed out portion of the resulting image. Using the stacked pixel devices of the invention, such image data may be preserved, because the underlying bottom photodiode provides an increase in the effective well capacity of the pixel.

In one embodiment, the two photodiodes are read out separately. In image data processing, the sum of the top and bottom photodiode signals, as well as the estimated attenuated photon flux by the intervening structure between the two photodiodes is used to calculate total photon flux incident upon the stacked pixel. In an alternative embodiment, accumulated charge from the two photodiodes is collected in a common floating diffusion node, and the additive photon flux is read out and used to estimate total photon flux received by the stacked pixel during the integration period.

Accordingly, in one aspect, the invention comprises a method of extending the dynamic range of a pixel by the use of two stacked photodiodes, wherein the light signal collected by the two photodiodes is used to estimate total photon flux received by the stacked photodiodes during the integration period. In one embodiment, the invention comprises a method of calculating incident photon flux during an integration period by summing the light accumulation signal of the top photodiode, the light accumulation of the bottom photodiode, and the estimated photon flux attenuated by the intervening structure between the two photodiodes, which can be estimated using the composition and properties of the intervening structure, taking into account the effects of overlaying color filters, if any.

In one embodiment, the stacked photodiode pixels of the invention are utilized with an overlaying color filter array, e.g. a Bayer array. In another embodiment, the stacked photodiode pixels of the invention are utilized in low light applications, without any overlaying color filters. Even in low-light imaging, some portion of the imaged scene may be brightly illuminated (e.g. areas representing light sources or areas directly illuminated by light sources). The extended dynamic range of the stacked photodiode pixels allows imaging in such areas of an imaged scene.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

The invention claimed is:

1. A pixel comprising
a first wafer, comprising a first pinned photodiode; and
a second wafer, comprising a second pinned photodiode; wherein
the first wafer is bonded to the second wafer such that the first pinned photodiode is above the second pinned photodiode;
the first wafer comprises a transfer gate;
the second wafer comprises readout and reset elements for the first pinned photodiode; and
a first interconnect between the first and second wafers controls the operation of the transfer gate and a second interconnect between the first and second wafers allows charges to transfer from the first pinned photodiode to a floating diffusion node on the second wafer.

2. The pixel of claim 1, wherein
the first and second pinned photodiodes comprise a region of n-doped silicon within a p-type silicon wafer and the pinning layer comprises a heavily p-doped layer adjacent to the n-doped region.

3. The pixel of claim 1, wherein
a color filter is present over the stacked photodiodes.

4. The pixel of claim 1, wherein
no color filter is present over the stacked photodiodes.

5. The pixel of claim 1, wherein
one or more intervening layers is present between the first and second wafers.

6. The pixel of claim 5, wherein
the one or more intervening layers comprises an adhesive material.

7. The pixel of claim 6,
wherein the one or more intervening layers comprises a narrow-wavelength filter.

8. An image sensor, comprising
an array of pixels, the array comprising multiple rows and columns, wherein the array comprises a first wafer comprising pixel sites, each comprising a pinned photodiode, and a second wafer comprising pixel sites, each comprising a pinned photodiode; and wherein
the first wafer is bonded to the second wafer such that the pixel sites of the first wafer are aligned above the pixel sites of the second wafer such that the pinned photodiode of each pixel site of the first wafer is aligned above the pinned photodiode of each pixel site of the second wafer; and wherein one wafer comprises an array of pixels configured to operate in rolling shutter mode and one wafer comprise an array of pixels configured to operate in global shutter mode.

9. A method of calculating photon flux incident upon a pixel during an integration cycle, wherein the pixel comprises two pinned photodiodes, one disposed above the other; and photon flux measured by the two pinned photodiodes is used to quantify light incident upon the pixel; wherein photon flux incident upon each of the two pinned photodiodes is measured using a common floating diffusion node; and a factor representing the estimated photon attenuation by structures and/or material separating the two pinned photodiodes is added to the summed photon flux measured by the two pinned photodiodes.

* * * * *